United States Patent [19]

Peters

[11] 4,266,157
[45] May 5, 1981

[54] PIEZOELECTRIC RESONATOR ASSEMBLY WITH THIN MOLYBDENUM MOUNTING CLIPS

[75] Inventor: R. Donald Peters, Pinellas Park, Fla.

[73] Assignee: The United States of America as represented by the Secretary of the Army, Washington, D.C.

[21] Appl. No.: 40,361

[22] Filed: May 18, 1979

[51] Int. Cl.³ .......................................... H01L 41/08
[52] U.S. Cl. ................................ 310/353; 310/346; 310/348; 310/344
[58] Field of Search ............... 310/348, 344, 351–355, 310/346

[56] References Cited

U.S. PATENT DOCUMENTS

| | | | |
|---|---|---|---|
| 2,850,651 | 9/1958 | Hoffman | 310/353 |
| 2,954,490 | 9/1960 | Warner, Jr. | 310/353 X |
| 3,263,103 | 7/1966 | Fraser et al. | 310/353 X |
| 3,697,766 | 10/1972 | Ganter et al. | 310/348 |
| 3,796,968 | 3/1974 | Luscher | 310/353 X |
| 3,849,681 | 11/1974 | Scott, Jr. et al. | 310/346 X |
| 3,931,388 | 1/1976 | Hafner | 310/353 X |
| 4,027,181 | 5/1977 | Moreillon | 310/348 |
| 4,136,297 | 1/1979 | Briese | 310/353 |
| 4,160,928 | 7/1979 | Nakayama et al. | 310/353 |

FOREIGN PATENT DOCUMENTS

| | | |
|---|---|---|
| 1157673 | 1/1960 | Fed. Rep. of Germany . |
| 2500687 | 7/1975 | Fed. Rep. of Germany . |

*Primary Examiner*—Mark O. Budd
*Attorney, Agent, or Firm*—Nathan Edelberg; Robert P. Gibson; Daniel D. Sharp

[57] ABSTRACT

A resonator mounting assembly wherein the resonator blank is mounted against an essentially planar surface presented by a plurality of peripherally disposed mounting clips and bonded to this surface to provide substantially all the mechanical support for the blank in a direction normal to the major faces of the resonator blank, while being flexible in the directions parallel to said major faces so as to minimize radial stresses on the resonator blank, particularly during thermal cycling of the resonator assembly. The clips are fabricated of a low thermal expansion material, such as molybdenum, which also has considerable yield strength after exposure to processing temperatures; the bonding of the clips to the edges of the resonator blank can be achieved by a polyimide containing electrically conductive particles.

5 Claims, 5 Drawing Figures

PIEZOELECTRIC RESONATOR ASSEMBLY WITH THIN MOLYBDENUM MOUNTING CLIPS

The invention described herein was developed under a contract with Department of Energy.

BACKGROUND OF THE INVENTION

The development of crystal resonator assemblies which are sufficiently rugged to withstand use in artillery-delivered electronic devices has been plagued by various problems. For example, as indicated in an article by Messrs. Filler, Frank, Peters and Vig appearing in the Proceedings of the 32nd Annual Symposium on Frequency Control held on 31 May-2 June 1978, a nickel rim electroplated onto a quartz blank permits resonators to survive high shock levels but the process of electrobonding is difficult to implement and control. A piezoelectric resonator mounting assembly using a ceramic housing and spring clips is shown and described in U.S. Pat. No. 3,931,388 of Hafner and Vig. The spring clips, as indicated in FIGS. 2A to 2D of this patent, exert a radial pressure against the edge of this ceramic resonator blank and, under severe shock, these crystal blanks which can be of the order of 30 mils in thickness - often destruct. The thin-edged crystal blank is difficult to assemble in the spring clips of U.S. Pat. No. 3,931,388 without cracking since it must be forced into the withdrawn clips which then snap back against the thin edges (about 3.0 mils thick) of the crystal blank. Clips of the type shown in FIG. 2 of U.S. Pat No. 3,931,388 do not provide substantial strength in the direction of maximum stress during shock, namely, in a direction normal to the major faces of the crystal blank. Furthermore prior mounting structures require that the resonator blank be inserted into some structure; for example, the clips of FIG. 2 of the aforesaid patent must be moved to allow the thin edge of the crystal to fit into a recess, while, in FIGS. 6 to 8 of that patent, the crystal is inserted between the coils of one or more taut helical springs. The crystal can easily be damaged during such insertion.

SUMMARY OF THE INVENTION

The present invention provides a new type of mounting structure which has the advantages of ease of fabrication, including minimization of destructive forces exerted on the thin crystal blank, and capability of withstanding high shock environments. In the most basic form, a plurality of L-shaped mounting clips are used, each of which can be bonded to an appropriate mounting pin or base. Alternately, the mounting clips may be basically Z-shaped with the lower portion of the clip being bonded to an appropriate mounting base. The flat tops of the upper portion of the L-shaped or Z-shaped mounting clips preferably lie in a common plane and the resonator blank can be placed simply onto the coplanar flat surfaces of the mounting clips with a single vertical motion. The aforesaid geometry provides a particularly rigid support in the direction perpendicular to the resonator surface and in such a direction as to force the piezoelectric resonator blank down onto the mounting surface of the clips. This is advantageous when the resonator is subjected to a high shock load in one direction only, such as in devices which are fired from a weapon or dropped from an aircraft.

The L or Z-shaped mounting clips are particularly flexible in the directions parallel to the surfaces of the resonator blank so as to minimize radial stresses applied to the blank during thermal coupling of the assembly. This thermal processing —at temperatures as high as 900 degrees C.—is necessary for achieving a permanent blank-to-clip bond, whether that bond be in the form of a polyimide or epoxy bond or a bond obtained by soldering, brazing, spot welding or by diffusion. To further reduce thermal affects, the mounting clips preferably should be fabricated of a material, such as molybdenum or kovar, which has a low coefficient of thermal expansion to match as well as possible the low coefficient of thermal expansion of quartz. Molybdenum is a particularly suitable material for the mounting clips because of its high yield strength and high modulus of elasticity. In other words, each mounting clip must be able to maintain its original dimensions under the stresses to which the crystal resonator mounting assembly is subjected during the thermal bonding process and during actual use.

BRIEF DESCRIPTION OF DRAWING FIGURES

DETAILED DESCRIPTION OF PREFERRED EMBODIMENT

Figure 1:
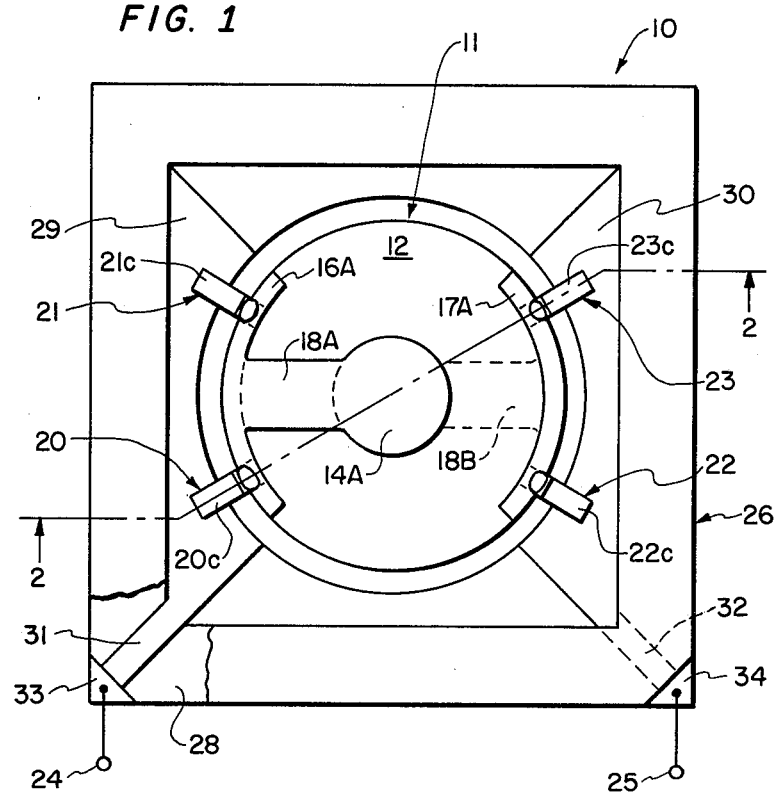
FIG. 1 is a plan view of a first embodiment of a crystal resonator mounting assembly according to the invention.
Figure 2:
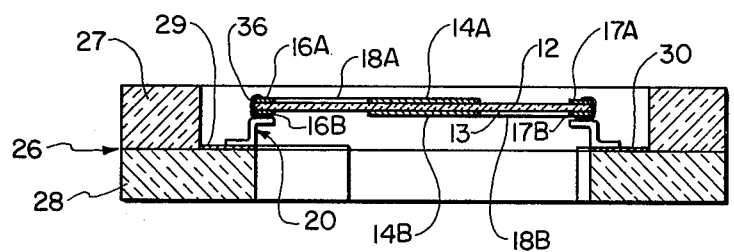
FIG. 2 is a section view taken along line 2—2 of FIG. 1.
Figure 3:
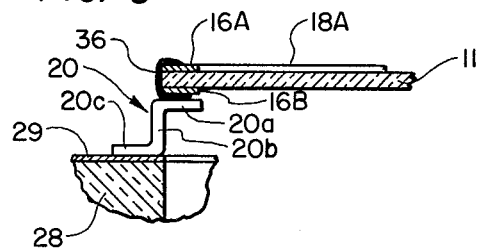
FIG. 3 is a view showing details of the device illustrated in FIG. 2.

Referring to FIGS. 1 to 3, a ceramic flat pack piezoelectric resonator mounting assembly 10 is shown which includes a thin piezoelectric blank 11 which may be a quartz crystal disc about 0.003 inch thick. An electrode 14A is deposited on the upper surface or face 12 of the crystal blank 11 and an electrode 14B, juxtaposed to electrode 14A, is deposited on the lower surface or face 13 of the resonator blank 11. The surfaces 12 and 13 of the resonator blank are provided with oppositely disposed arcuate metallic edge segments 16A, 17A and 16B, 17B, respectively which are connected to the respective circular, centrally disposed electrodes 14A and 14B by corresponding metallized layers 18A and 18B. For the sake of symmetry of design, the arcuate metallized segments 16A, 16B, 17A and 17B may be deposited on both surfaces of the resonator blank 11; however, for purposes of electrical connections, only one such arcuate segment is required for each of the opposed surfaces of the disc 11. The crystal blank is mounted on a plurality of electrically conducting mounting clips 20 to 23. By way of example, the clips have been fabricated from strips of molybdenum stock 1 mil thick and 30 mils wide; that is to say, the thickness is small compared with the width. The width of the mounting clips should be at least ten times the thickness. Four such mounting clips are illustrated, by way of example, arranged in oppositely disposed pairs 20, 21 and 22, 23, the pair 20, 21 constituting a portion of the electrical path between electrode 14A and one terminal 24 and the other pair 22, 23 providing a portion of the electrically conductive pathway between electrode 14B and the other resonator terminal 25. At least two mounting clips are required; however, any number in excess of two can be provided. See, for example the embodiment of FIGS. 4 and 5 in which three mounting clips are used. As indicated in FIGS. 2 and 3, the mounting clips 20, 21, 22 and 23 are more or less Z-shaped with respective upper portions 20a, and so forth, intermediate portion 20b, and so forth and a lower or base portions 20c, and so forth.

A mounting frame 26 which, for example, may be made of ceramic, comprises two rectangular members 27 and 28 which are joined during fabrication of the frame 26. Metallized ledges 29 and 30 are provided on lower member 28 and are connected internally, as by respective metallized extension strips 31 and 32, visible in FIG. 1, to respective external regions 33 and 34 of the frame formed by cutting away a corner portion of upper member 27.

The base portion 20c and 21c of the clips 20 and 21 are bonded, as by brazing, to metallized ledge 29 on electrically insulating member 28. Similarly, the base portion 22c and 23c of clips 22 and 23 are bonded to metallized ledge 30 on the member 28 of frame 26. Extending substantially normal to the base portions of each mounting clip, and to the major faces of the crystal blank 11 is the intermediate clip portion 20b, 21b, etc. which is considerably resistant to distortion under conditions of shock normally encountered, that is to say, the yield strength of this intermediate portion of each mounting clip is relatively high. The flat-topped upper portion of each of the mounting clips extends more or less parallel to the major surfaces 12 and 13 of the crystal blank 11; these upper portions of the mounting clips 20 to 23 preferably lie in a common plane. In one embodiment, a bit of polyimide adhesive 36 loaded with electrically conductive particles, such as silver or gold, is placed onto the top surface of the top portion 20a, 21a, etc. of each clip. The crystal resonator blank 11 is lowered gently onto the adhesive-coated upper portions of the mounting clips until contact is made with the adhesive material 36. An additional amount of adhesive material is deposited, as by a syringe, along the edge of the crystal blank in the vicinity of the mounting clips, as shown clearly in FIGS. 2 and 3.

As previously stated, the mounting clips 20 to 23, in addition to being electrically conductive, must have a high yield strength, in the direction normal to the major surfaces of the crystal blank 11, so as not to deform permanently when subjected to stresses experienced during shock. Furthermore, the clips must be flexible in directions parallel to the electroded surfaces 12 and 13 of the crystal blank 11 and of relatively low thermal coefficient of expansion so as to approach as closely as possible the low thermal coefficient of the quartz crystal blank. Molybdenum and kovar satisfy the latter requirement, but molybdenum is preferable for the mounting clips because of its high strength after exposure to the high temperatures (of the order of 900 degrees C.) at which the assembly is maintained during the necessary steps of the metal-to-metal bonding process.

Figure 4:
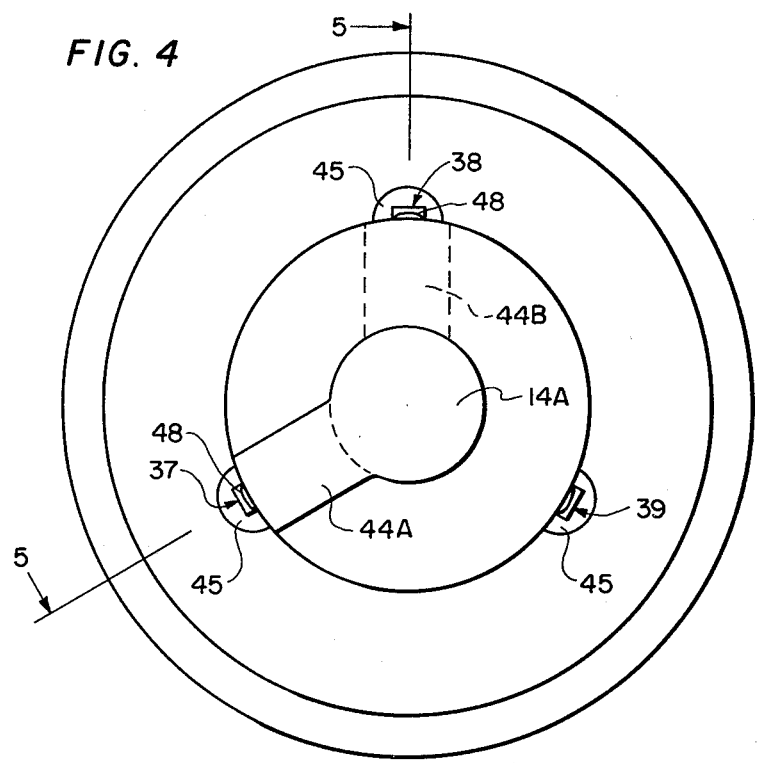
FIG. 4 is a plan view of a second embodiment of crystal resonator mounting assembly according to the invention.
Figure 5:
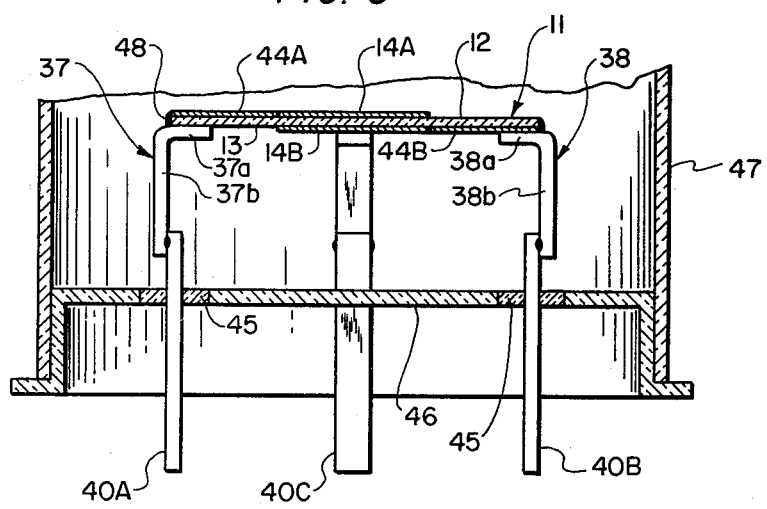
FIG. 5 is a section view taken along line 5—5 of FIG. 4.

An alternative embodiment of the invention is shown in FIGS. 4 and 5. In this embodiment, the mounting clips 37 to 39, as in the previous embodiment, each includes respective flat portion 37a, and so forth atop which the piezoelectric resonator blank 11 is positioned. The electrodes 14A and 14B on opposite faces of the resonator crystal blank 11A are connected to the edge of the resonator blank by metallized tabs 44A and 44B, respectively. However, the mounting clips 37 to 39 are now in the form of an inverted L, since the portions 37b, 38b, etc. which are normal to the major surfaces of the resonator blank are mounted, as by spot welding or brazing, to the terminal pins 40A and 40B extending through the electrically insulating beads 45 in electrically insulating base plate 46 attached to a cylindrical shell 47 which may be closed over at the end remote from the base plate 46. Although an adhesive bonding material can be used for attaching the electroded resonator blank to the flat portion of the mounting clip, as in FIGS. 1 to 3, the metallized edge portions of the crystal blank can be bonded directly to the metal L-clips by any one of several techniques such as brazing, soldering, spot welding, diffusion bonding, etc. In the embodiment of FIGS. 4, and 5, a metallized coating 48 must be applied to the edge of the resonator blank 11A in the vicinity of the appropriate set of mounting clips in order to complete the necessary conductive path from electrodes 14A and 14B to the corresponding external terminals 40A and 40B. The mounting case also includes an external terminal 40C which is not connected to any external circuit, but is merely used as an additional support means for the piezoelectric blank 11. When an adhesive bond 36 is used, of course, as in FIGS. 1 to 3, the particle-loaded polyimide itself serves as a conductive pathway between the electrodes and the respective electrically conductive mounting clips.

It follows, of course, that an adhesive bond, such as 36 in FIGS. 1 to 3 could be used in the embodiment of FIGS. 4 and 5 rather than the direct bond shown in FIGS. 4 and 5. Similarly, in the embodiment of FIGS. 1 to 3, direct bonding of the metallized arcuate segments 16B and 17B to the top surfaces of corresponding mounting clips 20, 21 and 22, 23 can be achieved without making use of an adhesive bond, such as the particle-loaded polyimide 36 shown in FIGS. 1 to 3.

Many other modifications will become apparent to those skilled in the art without departing from the spirit and scope of the invention as evidenced by the claims appended hereto:

I claim:

1. In a resonator assembly including a piezoelectric resonator blank capable of vibrating at a predetermined rate in response to electrical energy applied to electrodes attached to the major faces, the improvement comprising at least three substantially identical spaced molybdenum electrically conductive clips having a width of the order of thirty times the thickness disposed about the periphery of said resonator blank for mounting said resonator blank at a plurality of spaced regions around said blank;

each of said clips including a first portion parallel to said major faces, said first portions lying in a common plane, said resonator blank being mounted only atop the first portion of all of said clips;

each of said clips further including a second portion of thickness equal to or less than the thickness of said resonator blank disposed perpendicular to said major faces and providing relatively rigid support for said resonator blank in the direction normal to said major faces while being relatively flexible in directions parallel to said major faces for minimization of radial stresses applied to said resonator blank; and an electrically conductive polymide loaded with electrically conductive particles disposed between the first portion of each of the clips and the juxtaposed major surface of said crystal blank for bonding said resonator blank to said clips and along the edge of said resonator blank to establish an electrically conductive path between a given one of said electrodes and at least one corresponding clip.

2. In the resonator assembly according to claim 1, an electrically insulating mounting base to which said second portion of said clip is bonded.

3. In the resonator assembly according to claim 1, metallic contact segments disposed along the periphery of major faces of said resonator blank adjacent to said clips, said resonator blank being attached to said first portion of said clips with a metal fusion bond between the first portions of said clips and said metallic contact segments.

4. In the resonator assembly according to claim 1, said second portion of said clips being intermediate to said first portion and a third portion substantially parallel to said first portion, and an electrically insulating mounting frame to which the third portion of said clips is mounted, said frame including a central aperture surrounded by an annular ledge, juxtaposed spaced portions of said ledge being metallized for bonding thereto the third portions of said corresponding clips, said frame further including two exposed extended electrical contact pads which are internally connected to the respective metallized portions of said ledge.

5. In the resonator assembly according to claim 1, a housing within which said resonator blank and said mounting clips are enclosed.

terminal pins extending externally of said housing through an electrically insulating portion of said housing, said second portion of said mounting clips being directly bonded by a metal fusion technique to corresponding ones of said terminal pins.

* * * * *